United States Patent
Dakshina-Murthy et al.

(10) Patent No.: US 7,376,259 B1
(45) Date of Patent: *May 20, 2008

(54) TOPOGRAPHY COMPENSATION OF IMPRINT LITHOGRAPHY PATTERNING

(75) Inventors: Srikanteswara Dakshina-Murthy, Wappingers Falls, NY (US); Bhanwar Singh, Morgan Hill, CA (US); Ramkumar Subramanian, Sunnyvale, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 729 days.

This patent is subject to a terminal disclaimer.

(21) Appl. No.: 10/874,499

(22) Filed: Jun. 23, 2004

(51) Int. Cl.
*G06K 9/00* (2006.01)

(52) U.S. Cl. .................... 382/144; 430/313; 438/705

(58) Field of Classification Search ................ 382/144; 430/5, 322, 324, 22, 311, 296, 30, 312, 313, 430/394, 316, 330, 252, 314, 325, 329, 318, 430/258, 326, 328, 319; 438/689, 780, 963, 438/291, 305, 705, 585, 592, 631, 209, 692, 438/671, 952, 753, 699, 717, 645; 250/492.1, 250/310, 492.22, 398; 216/26, 66, 24; 355/67, 355/53, 75, 78, 91; 428/209; 716/19–21; 101/368, 450.1, 453, 463.1
See application file for complete search history.

(56) References Cited

OTHER PUBLICATIONS

U.S. Appl. No. 10/874,498, filed Jun. 2004, Eash, Brady.*

* cited by examiner

*Primary Examiner*—Sheela Chawan
(74) *Attorney, Agent, or Firm*—Amin, Turocy & Calvin, LLP

(57) ABSTRACT

The present invention relates generally to photolithographic systems and methods, and more particularly to systems and methodologies that modify an imprint mask. An aspect of the invention generates feedback information that facilitates control of imprint mask feature height via employing a scatterometry system to detect topography variation and, decreasing imprint mask feature height in order to compensate for topography variation.

22 Claims, 10 Drawing Sheets

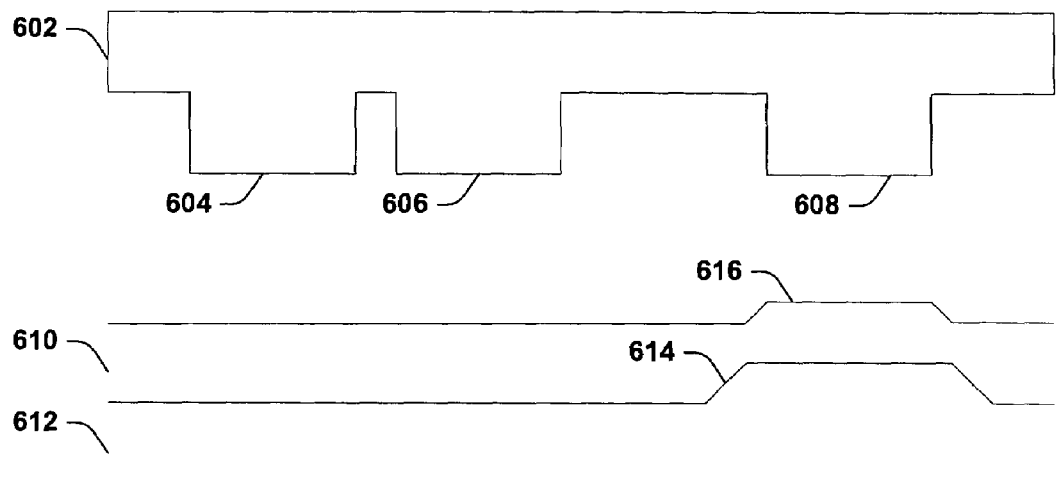
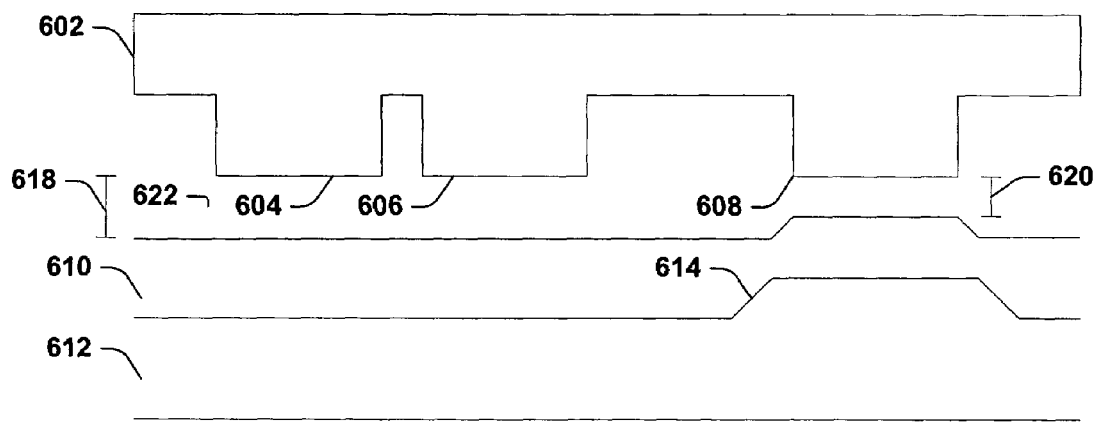
FIG. 6

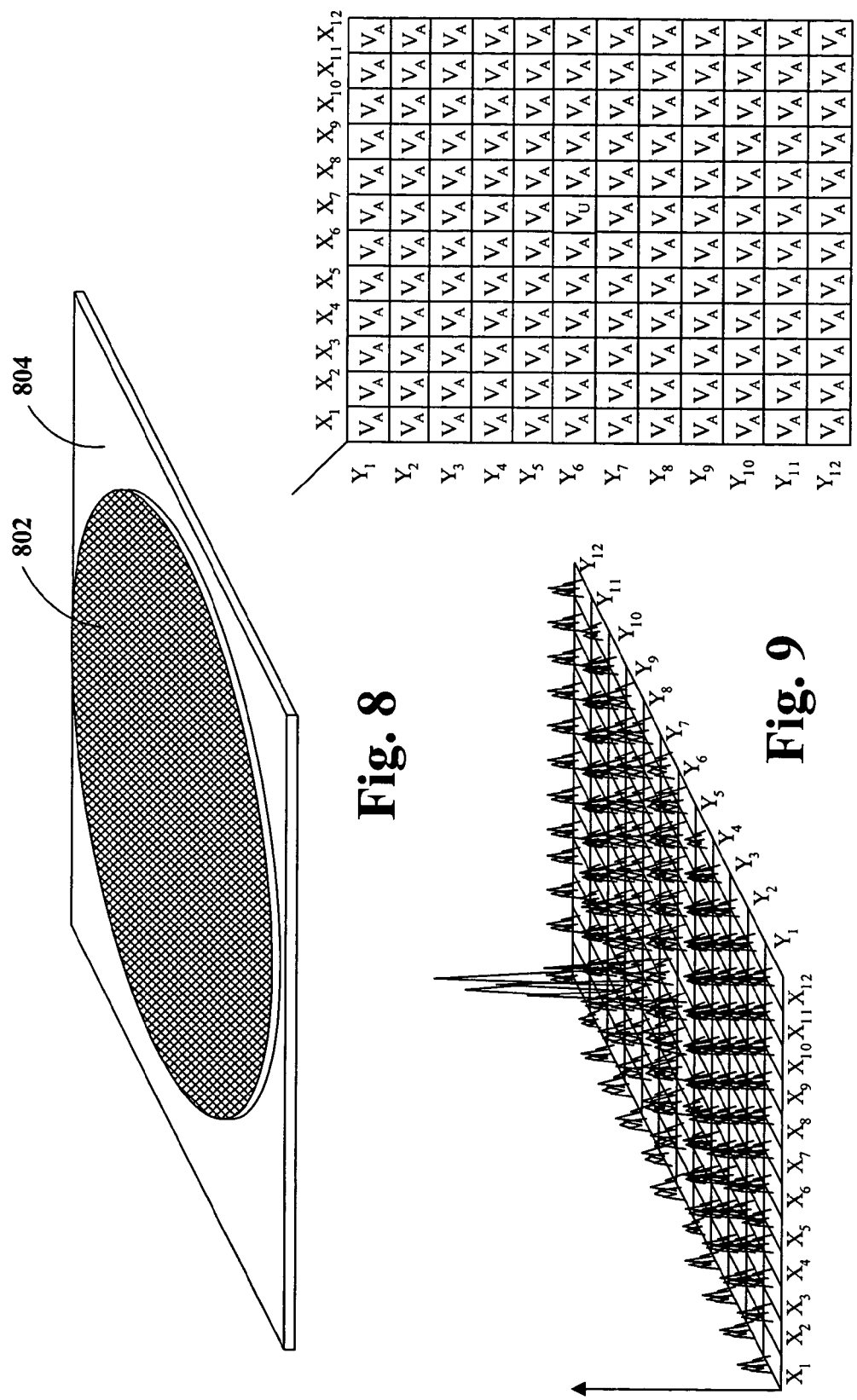

TOPOGRAPHY COMPENSATION OF IMPRINT LITHOGRAPHY PATTERNING

TECHNICAL FIELD

The present invention relates generally to photolithographic systems and methods, and more particularly to systems and methodologies that modify imprint mask imprint mask features.

BACKGROUND OF THE INVENTION

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to transfer of patterns onto a thin film that has been deposited onto a substrate. The transferred patterns then act as a blueprint for desired circuit components. Typically, various patterns are transferred to a photoresist (e.g., radiation-sensitive film), which is the thin film that overlies the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permit a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Current methods of pattern line formation on a photolithographic mask typically produce LER as an undesirable side effect which can increase imprint mask fabrication cost. As lithographic techniques are pushed to their limits, smaller and smaller CDs are desired to maximize chip performance. Thus, chip manufacture is governed largely by wafer CD, which is defined as the smallest allowable width of, or space between, lines of circuitry in a semiconductor device. As methods of wafer manufacture are improved, wafer CD is decreased, which in turn requires finer and finer line edges to be produced, which further requires finer and finer mask features.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that mitigate the topography variations found within lithography. More specifically, the systems and methods of the invention can mitigate topography variations by reducing the local imprint mask feature height in order to improve imprint mask performance. Mitigation of long range topography variation within photolithography minimizes mask production costs and ultimately improves chip performance.

According to an aspect of the invention, topography of a substrate can be monitored to detect the presence of a topography variation. A monitoring component, such as, for example, a scatterometry system, can provide real-time information regarding the status of the substrate topography and at least one feature on an imprint mask. If topography variation is detected, a control component can modify the imprint mask in order to compensate for the detected topography variation. The control component can provide an etch process on the feature in order to selectively decrease feature height in order to compensate for the topography variation. Additionally, the control component can make determinations regarding whether topography variations are present, whether extant topography variations are potentially detrimental to a wafer, whether compensatory action was successful in mitigating detected topography variation, etc., based on information received from the monitoring component.

According to another aspect of the invention, inferences can be made regarding, for example, whether to initiate compensatory action to correct detected topography variation. Such inferences can be based on, for example, information related to the severity of the topography variation, the number of topography variations detected, the location of detected topography variation, etc. For example, a topography variation that is detected in a non-critical area can be ignored, thus saving costs and time associated with compensating for the topography variation. This aspect of the invention permits greater efficiency and economic benefit by augmenting the criteria germane to making a decision regarding compensating for potentially destructive topography variations.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to comprise all such aspects and their equivalents. Other advantages and novel features of the invention will become apparent from the following detailed description of the invention when considered in conjunction with the drawings.

BRIEF DESCRIPTION OF THE DRAWINGS

FIG. 6 illustrates a cross-sectional view of an imprint mask in accordance with an aspect of the present invention.

FIG. 8 illustrates a perspective view of a grid-mapped mask according to one or more aspects of the present invention.

FIG. 9 illustrates plots of measurements taken at grid-mapped locations on a mask in accordance with one or more aspects of the present invention.

FIG. 10 illustrates a table containing entries corresponding to measurements taken at respective grid-mapped locations on a mask in accordance with one or more aspects of the present invention.

DETAILED DESCRIPTION OF THE INVENTION

Figure 1:
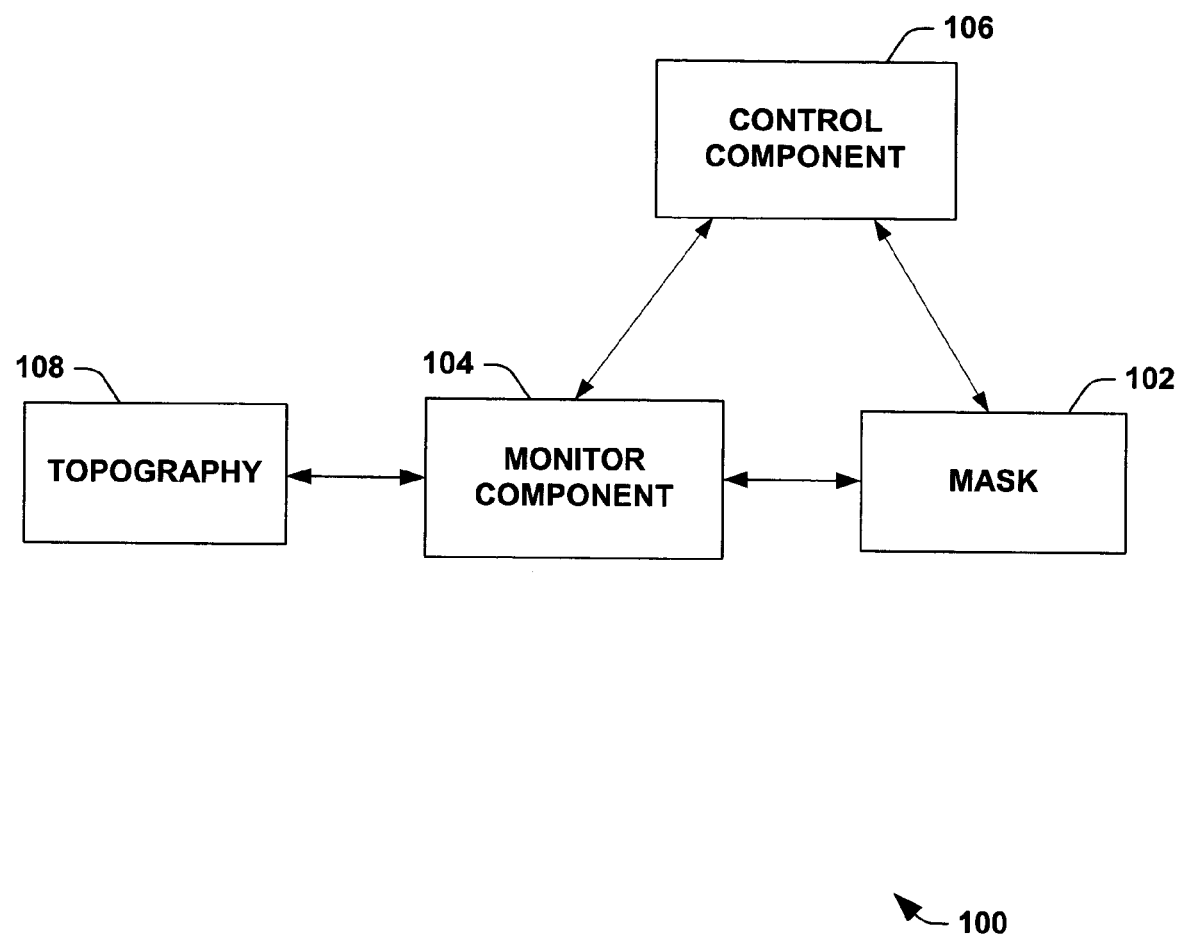
FIG. 1 is an illustration of imprint mask enhancement system in accordance with an aspect of the present invention.

The present invention will now be described with reference to the drawings, wherein like reference numerals are used to refer to like elements throughout. The present invention will be described with reference to systems and methods for mitigating substrate topography effects on imprint mask features. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

Imprint lithography uses a patterned mask to "imprint" a pattern on a resist at a 1:1 feature size ratio. Imprint masks are defined at 1X (e.g., using an e-beam direct write). The 1X definition is an extremely expensive process in which errors can be costly. Moreover, critical dimension (CD) errors cannot be compensated after a lithography imprint mask is fabricated. Thus, expensive imprint mask fabrication results due to repeat manufacturing attempts based upon CD errors. Imprint mask integrity must be maintained throughout the lithography process because any flaw or structural defect present on a patterned imprint mask can be indelibly transferred to underlying layers during imprinting of a photoresist. Moreover, the topography of the underlying substrate can affect the efficiency of the imprint mask and ultimately the chip performance. The imprint lithography process uses a spin coated photoresist into which the imprint mask features are transferred. The process of spin coating is inherently planarizing i.e. the thickness of the photoresist layer is thicker/thinner in regions where local topography is lower/higher than the mean over the wafer. Since imprint mask features (defined in the quartz mask) are typically all of the same height, this can lead to the imprint mask leaving undesirable puddles of photoresist in low lying areas, and possibly even contacting the underlying substrate in high level areas, both of which lead to process variation and potentially generate undesired defects. For example, undesirably long overetch processes etc. are required for image transfer in regions with thick underlying photoresist which leads to loss of CD control and can be disastrous for a 1X feature transfer process. Therefore, any approach to mitigate local topography helps with the practical implementation of imprint lithography.

The topography of the underlying substrate can have a negative effect within imprint lithography based at least upon affecting the transfer into the underlying layer. Long-range topography can be caused by systematic planarization effects. Ideally, the flatness of the substrate is important to the lithography process. The image transfer between the imprint mask and the image layer can reflect any flaw or defect based upon the long range topography. Thus, imprint mask integrity and topography are crucial elements that must be maintained throughout the lithography process.

FIG. 1 illustrates an imprint mask enhancement system 100 in which the imprint mask is modified to compensate for long range topography variations within imprint lithography. For example, the imprint mask 102 can be, but not limited to, quartz. A monitor component 104 provides the detection of long range topography conditions during and/or after the imprint mask fabrication. The topography 108 can be determined by, for example, the monitoring of the underlying substrate, the transfer layer, the image layer, etc. for a topography variation.

Moreover, the monitor component 104 can be operatively coupled to the imprint mask 102. For example, the monitor component 104 can monitor aspects and/or conditions associated with the imprint mask 102 in order to glean information associated with the monitored long range topography 108. Such information can be relayed to the control component 106 for analysis. If information gathered by the monitor component 104 is indicative of a need to correct topography conditions, the control component 106 can initiate compensatory action to augment the imprint mask 102 to modify the imprint mask to compensate for long range topography variation. Upon detection of topography variation or discrepancy from the monitor component 104, the control component 106 can employ the compensation of the imprint mask 102 to account for the topography error.

The control component 106 compensates for the topography 108 by modifying the imprint mask feature height with a trim etch process (e.g., wet or dry etch) allowing the imprint mask feature height to be decreased. By using a trim etch process to compensate for the topography 108, the imprint mask feature height on the imprint mask 102 is decreased which ultimately reduces the effect of long range topography with the imprint mask performance. Note that this process requires the use of an additional mask step during the imprint mask formation process. The areas on the mask to be locally recessed are defined using a relatively low resolution lithography process (since local topography variation occurs on a length scale on the order of microns), followed by the etch process to recess those particular areas.

Dry etch is preferred since the imprint mask features are transferred with minimal CD deviation. The additional cost of this masking act is compensated by the increased quality of the imprint lithography step, which can be repeated on many die/wafers.

To further this example, if the monitor component 104 can monitor the topography 108 to detect a condition indicative of compensation of the imprint mask 102 and associated feature height, then the control component 106 can utilize a trim etch process (e.g., wet or dry etch) to selectively etch, for example, the quartz imprint mask and associated feature height(s). The control component 106 can selectively etch the imprint mask feature(s) in a manner that decreases the imprint mask feature height allowing for the gap distance between the imprint mask features and the underlying layers to be equivalent and/or within a declared tolerance. Thus, the imprint mask can be modified in order to compensate for long range topography which ultimately improves integrity and product quality.

The present invention can utilize a trim etch process in order to enhance the resolution of the imprint mask and the associated imprint mask features. The etching process removes selected areas from the imprint mask 102. For example, "dry" (e.g., plasma) etching can be used for critical circuit-defining steps, while "wet" etching (e.g., using chemical baths) is mainly used to clean wafers. Dry etching is one of the most frequently used processes in semiconductor manufacturing. Before etching begins, a target area (e.g., imprint mask) is coated with photoresist and exposed to a circuit pattern during photolithography. Etching removes material only from areas dictated by the photoresist pattern. Plasma etching is performed by applying an electrical field to a gas containing some chemically reactive element (e.g., fluorine or chlorine). The plasma releases chemically reactive ions that can remove or etch materials quickly. In addition, the chemicals are given an electric charge, which directs them vertically. This allows the achievement of nearly perfect vertical etching profiles, a critical characteristic for etching features within photolithography.

The present invention is not limited to performing the trim etch protocol described above on a quartz imprint mask, but rather can employ any suitable material utilized for an imprint mask within photolithography. For example, it is to be appreciated if the mask is formed of a sapphire substrate, than any suitable trim etch process whose properties are compatible with sapphire can be employed by the present invention.

It is to be appreciated that the monitor component 104 can be, for example, a scatterometry component. An advantage associated with employing a scatterometry system to monitor an imprint mask is that retrograde profiles on mask features can be detected without requiring cross-sectioning of the mask. The present invention contemplates any suitable scatterometry component and/or system, and such systems are intended to fall within the scope of the hereto-appended claims. It is further to be appreciated that the monitor component 104 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 104 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

Moreover, the control component 106 can provide an equivalent and/or within a tolerant level gap distance between the imprint mask feature(s) and the underlying layer(s) which ultimately lead to compensation for any long range topography variation the monitor component 104 has detected. For example, a topography variation can be detected by the monitor component 104 on the underlying layer(s). The topography can cause a distance of X between the imprint mask feature and the underlying later. However, there is an error distance of Y based on the detected long range topography. By employing a trim etch process, the imprint mask feature can be compensated in height by a distance Y in order to achieve the correct distance between the imprint mask feature and the underlying layer(s). In other words, the imprint mask feature is decreased in height by an amount based at least in part upon the detected topography. Thus, the control component 106 can employ the necessary enhancements (e.g., wet or dry trim etch processes) in order to decrease the imprint mask feature height providing a compensation for the detected long range topography.

Figure 2:
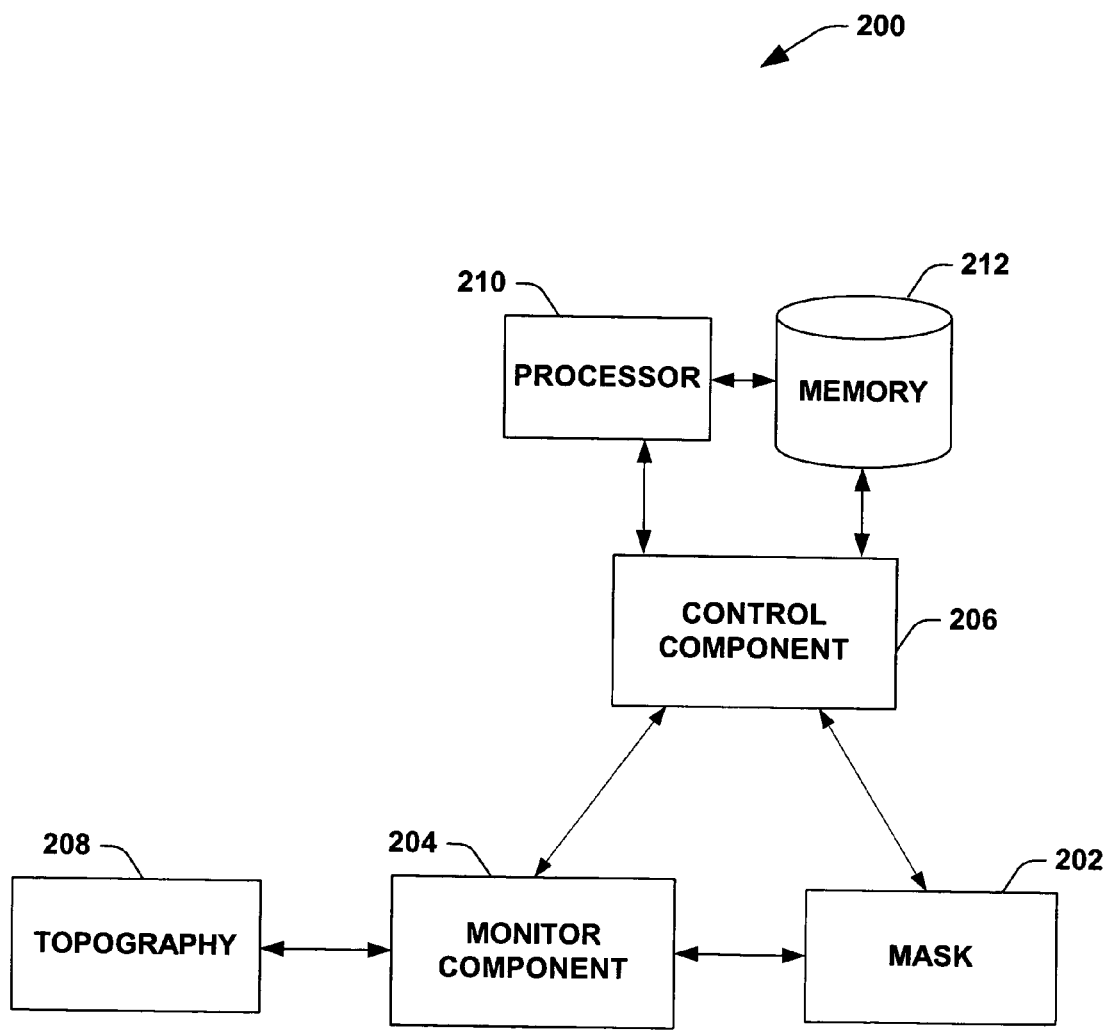
FIG. 2 is an illustration of imprint mask enhancement system in accordance with an aspect of the present invention comprising processor and a memory.

Now referring to FIG. 2, an illustration of an imprint mask enhancement system 200 provides the decrease of imprint mask feature height in which long range topography variation is compensated. The control component 206 is operatively associated with a processor 210 and a memory 212, both of which are operably coupled to each other. It is to be understood that a that the processor 210 can be a processor dedicated to determining whether compensation of topography 208 is necessary, a processor used to control one or more of the components of the present system(s), or, alternatively, a processor that is used to determine whether compensation of topography 208 is necessary and to control one or more of the components of the imprint mask enhancement system 200.

The memory component 212 can be employed to retain mask identification information, mask profile and lateral line dimensions, mask CD, semiconductor fabrication data, etc. Furthermore, the memory 212 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 212 of the present systems and methods is intended to comprise, without being limited to, these and any other suitable types of memory.

Figure 3:
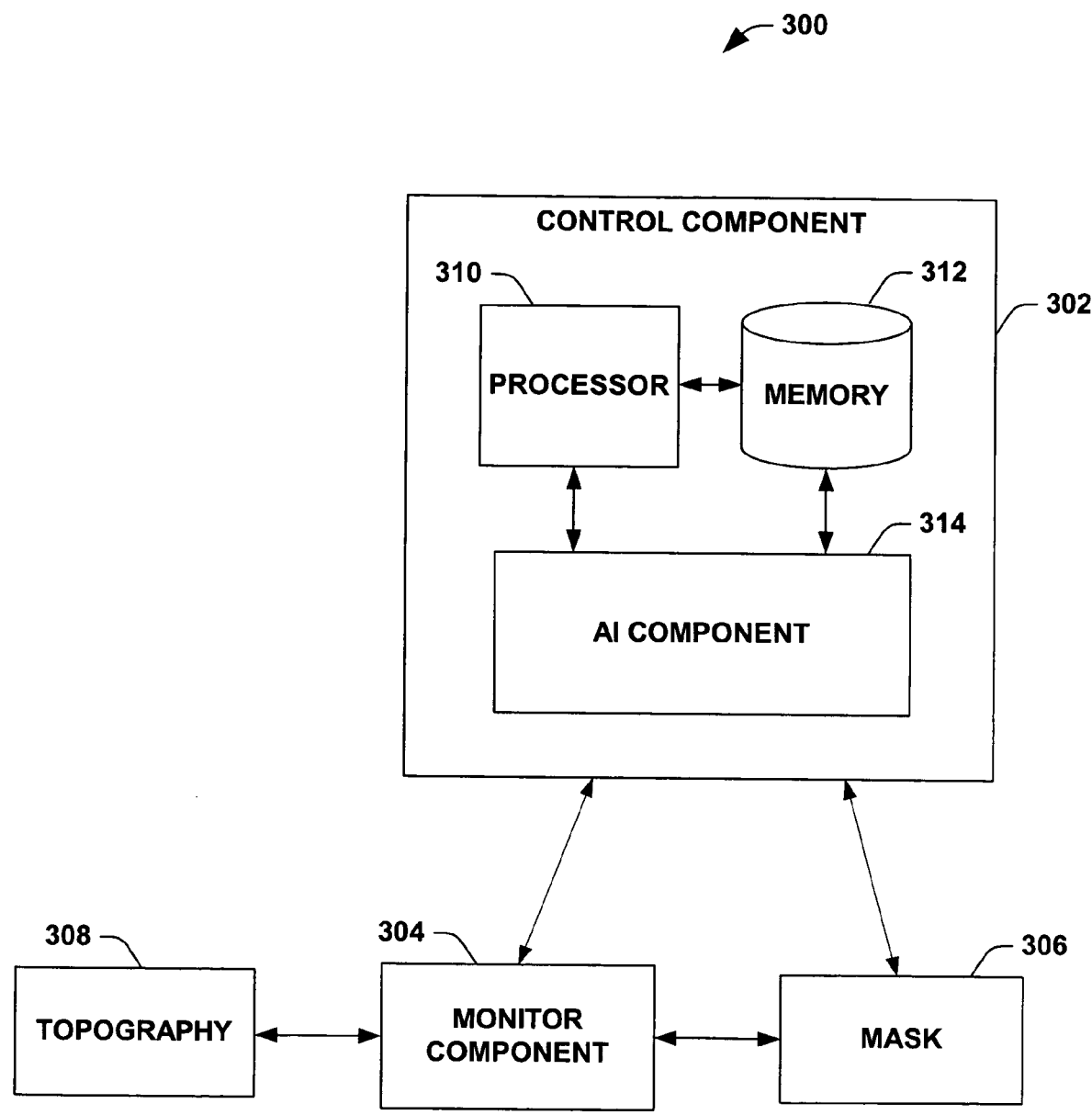
FIG. 3 is an illustration of a mask critical dimension modification system in accordance with the present invention wherein a modification component further comprises an artificial intelligence component

FIG. 3 is an illustration of an imprint mask enhancement system 300 in accordance with an aspect of the present invention. The imprint mask enhancement system 300 can employ various inference schemes and/or techniques in connection with compensating for long range topography by decreasing the height of the imprint mask features. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, the imprint mask enhancement system 300 comprises a control component 302 that is operatively coupled to a monitor component 304. The monitor component 304 monitors the status of an imprint mask 306 and transmits data associated therewith to the control component 302. In addition, the monitor component 304 monitors long range topography 308 and transmits data associated therewith to the control component 302. The control component 302 comprises a processor 310 that can analyze data received from the monitor component 304, and a memory component 312 that can store information related to various aspects of the imprint mask 306 and/or the topography 308. The control component 302 also comprises an artificial intelligence (AI) component 314 that can make inferences regarding system operation, such as whether and/or to what extent topography compensation should be taken to enhance the imprint mask features on the imprint mask 306.

For example, the AI component 314 can determine an optimal duration for employing the trim etch process, the optimal process to be used (e.g., dry or wet etch process), the amount of etch to be done on an imprint mask requiring topography compensation enhancement, etc. According to another example, the AI component 314 can make inferences regarding whether the detected topography 308 will adversely affect a wafer based on, for instance, location, amount, size, etc. These examples are given by way of illustration only and are not in any way intended to limit the scope of the present invention or the number of, or manner in which the AI component makes, inferences.

Figure 4:
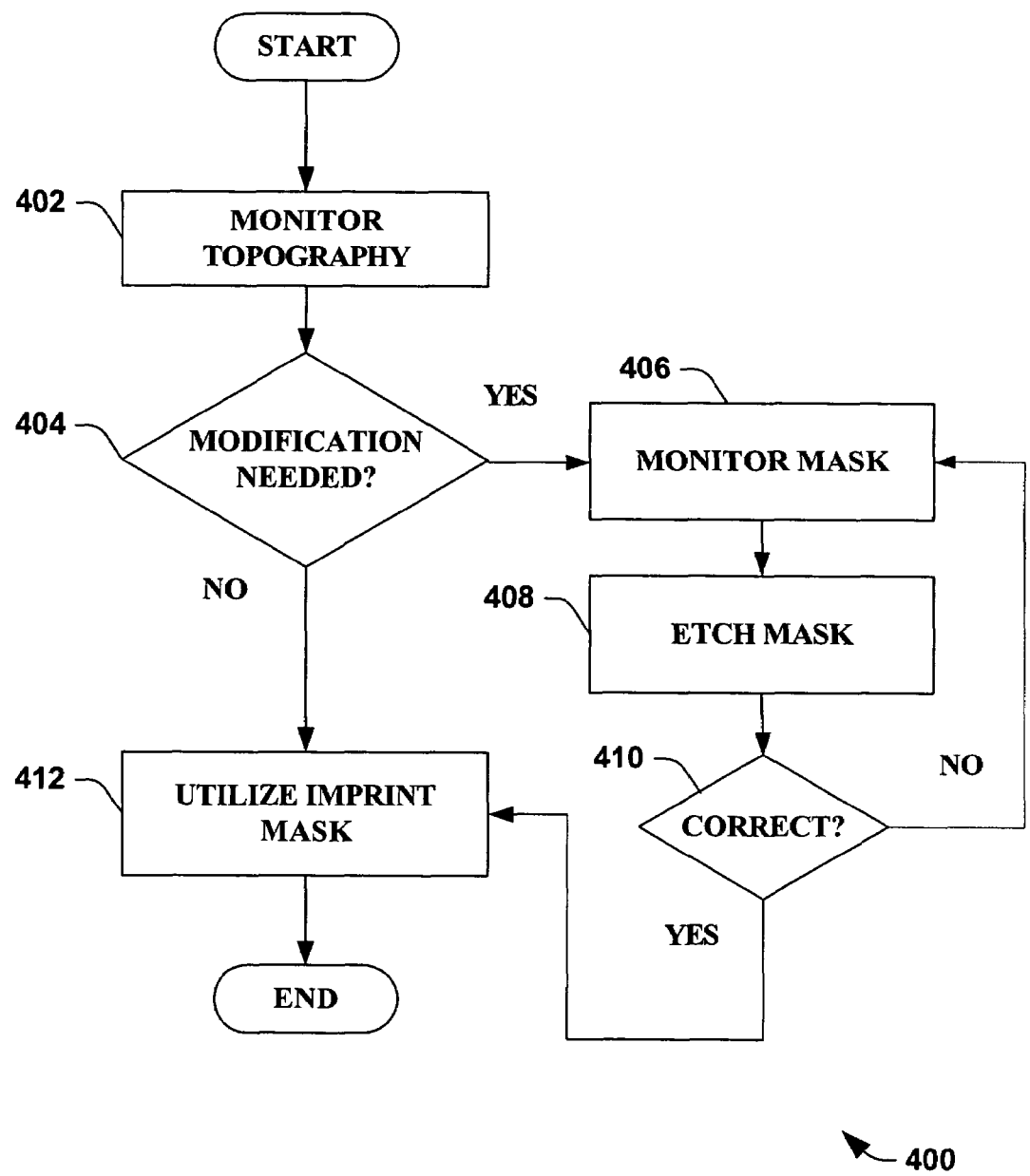
FIG. 4 is an illustration of a flow diagram of a methodology in accordance with an aspect of the present invention.
Figure 5:
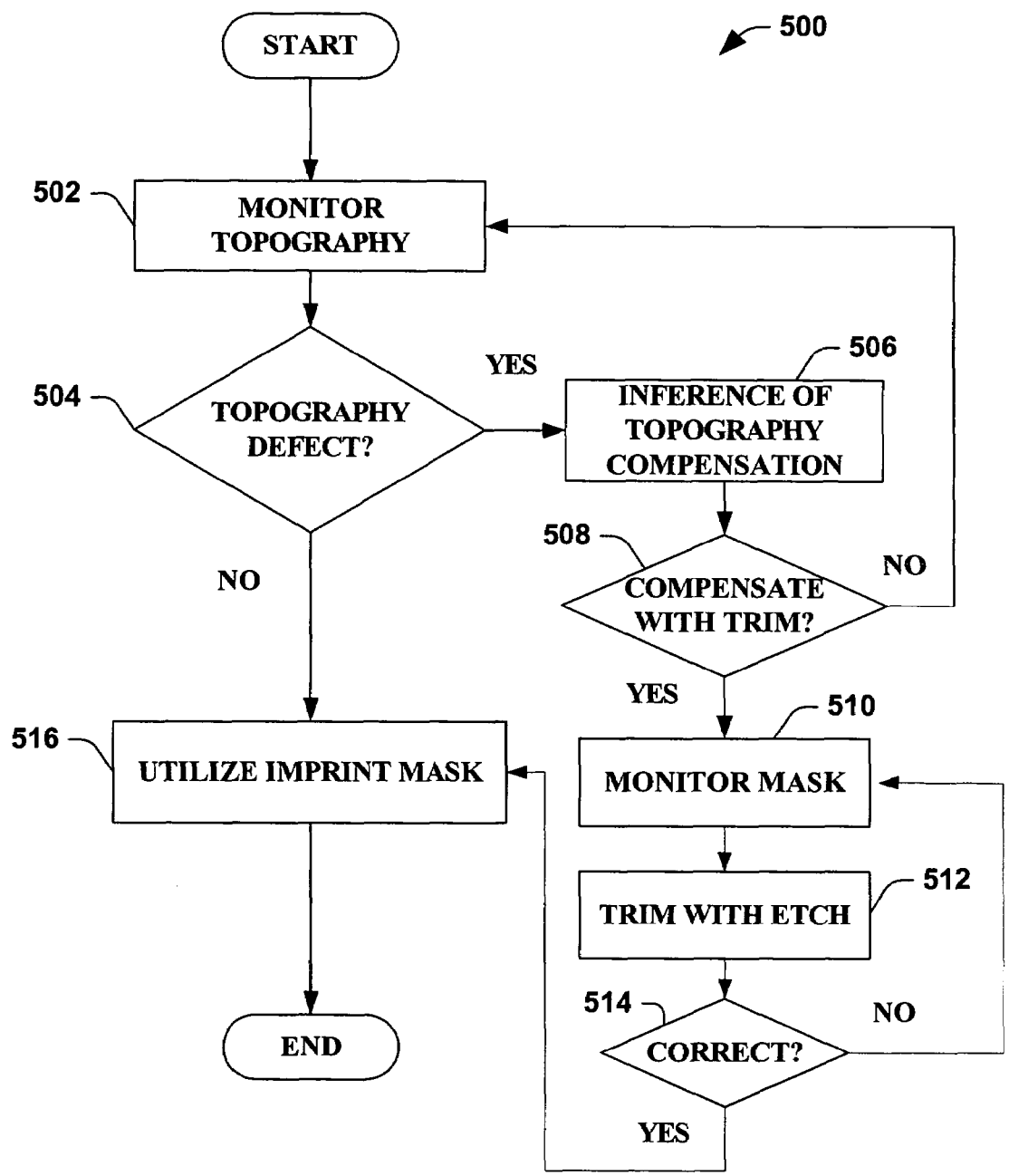
FIG. 5 is an illustration of a flow diagram of a methodology in accordance with an aspect of the present invention.

Now turning to FIGS. 4 and 5, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 4 is an illustration of a methodology 400 in accordance with an aspect of the present invention. At 402, long range topography is monitored. The topography is monitored via, for example, a scatterometry system. Scatterometry offers several advantages over other monitoring methods, including but not limited to, an ability to detect long range topography without requiring a cross-sectional image of any underlying substrate layer(s). For example, the topography can be mapped out from the underlying substrate. At 404, a determination is made whether or not to modify the imprint mask based at least upon the long range topography and any variations associated. For example, the long range topography compensation can be based upon, imprint mask feature height decrease request, topography variation percentage, etc. If it is determined at 404 that no modification(s) are necessary to the imprint mask based upon the detected topography, then the methodology can proceed to 412, where the mask is further utilized. If the modification of the imprint mask is needed at 404, the methodology proceeds to 406, where the imprint mask can be monitored. The imprint mask can be monitored in order to determine the information necessary to perform compensation procedures. Such information can be, for example, imprint mask feature characteristics, imprint mask information, imprint mask feature dimension, etc. Proceeding to 408, a trim etch process can be employed. The trim etch process can be a dry etch or a wet etch. The trim etch process provides the decrease in height of the imprint mask feature allowing for compensation of the detected long range topography. For example, the trim etch process can remove quartz material from a selected imprint mask feature from the imprint mask creating decrease in height on the imprint mask feature. It is to be appreciated that quartz is an exemplary material for the imprint mask, however, any suitable material (e.g., fused-silica, chrome, etc.) having properties consistent with those of the trim etch process chosen (e.g., dry, wet, etc.) can be utilized, and the present invention contemplates any and all such materials and processes. At 410, the methodology determines whether or not the etch correctly compensated for the detected long range topography. If the etch was correct, the methodology reverts to 412, where the mask is utilized. If the etch was not correct, the methodology can then revert to 406 for further monitoring and imprint mask detection to ensure that the topography compensation measures were successful.

FIG. 5 is an illustration of a methodology 500 in accordance with an aspect of the present invention. A topography is monitored via, for example, a scatterometry system, at 502. At 504, a determination is made as to whether, for example, the long range topography error or variation is detected. If no topography compensation is necessary for the mask at 504, then the imprint mask can be utilized to continue the wafer imprint process at 516. If the imprint mask topography compensation is necessary at 504, then inferences can be made regarding whether to take corrective action at 506. At 508, a determination is made regarding whether to initiate topography compensation measures on the imprint mask feature(s), based at least in part on inferences made at 506. For example, a topography can be monitored and have a variation in long range topography such that compensation be required (e.g., not meeting a flatness requirement). Yet such topography detection can be such that it will not adversely affect a wafer imprinted by the imprint mask. Inferences regarding, for example, the location of the long range topography error, severity of the topography detected, etc., can be utilized to determine whether the topography compensatory action is necessary. If it is determined that the particular detected topography will not be detrimental to the wafer upon imprinting, then the method can proceed to 502 and the topography can be monitored. If it is determined that the topography requires compensatory action, then the methodology can proceed to 510, where the imprint mask is monitored to gather the necessary information regarding the imprint mask and associated features. At 512, a trim etch process can be employed providing the imprint mask feature sizes to decrease in height which ultimately compensate for the detected long range topography. The trim etch process can be, for example, a wet or dry etch process. Once the trim etch process is complete, the system can determine if the compensatory action is correct at 514. If the action was not correct, the method can revert to 510 for further monitoring in order to verify that the resolution compensation measure was successful. If the action was correct, the method can revert to 516 where the imprint mask is utilized.

FIG. 6 is a cross-sectional view 600 of a post fabrication imprint mask 602 having features 604, 606, and 608 that exhibit various profiles used in the lithography process. Moreover, the cross-sectional view 600 exhibits a transfer layer 610, and a substrate layer 612. The substrate topography can demonstrate a variation 614 that will be reflected in the transfer layer as shown by 616. As the imprint mask 602 is used within the lithography process (as shown by the arrows), the imprint mask 602 makes contact with an image layer 622. Without utilizing the present invention, the imprint mask features 604, 606, and 608 are not compensated thus forcing a gap distance variation between at least one of the imprint mask features 604, 606, or 608. In other words, during the imprint lithography process, a variation 614 in the substrate layer 612 can be reflected in the transfer layer 610 in which the gap distance between the features and the transfer layer 610 would not be equivalent or within a declared tolerance. A variation 614 causes a smaller gap distance 620 between the imprint mask feature 608 and the transfer layer 610. Ideally, the gap distance 618 should be for each of the imprint mask features 604, 606, and 608.

Figure 7:
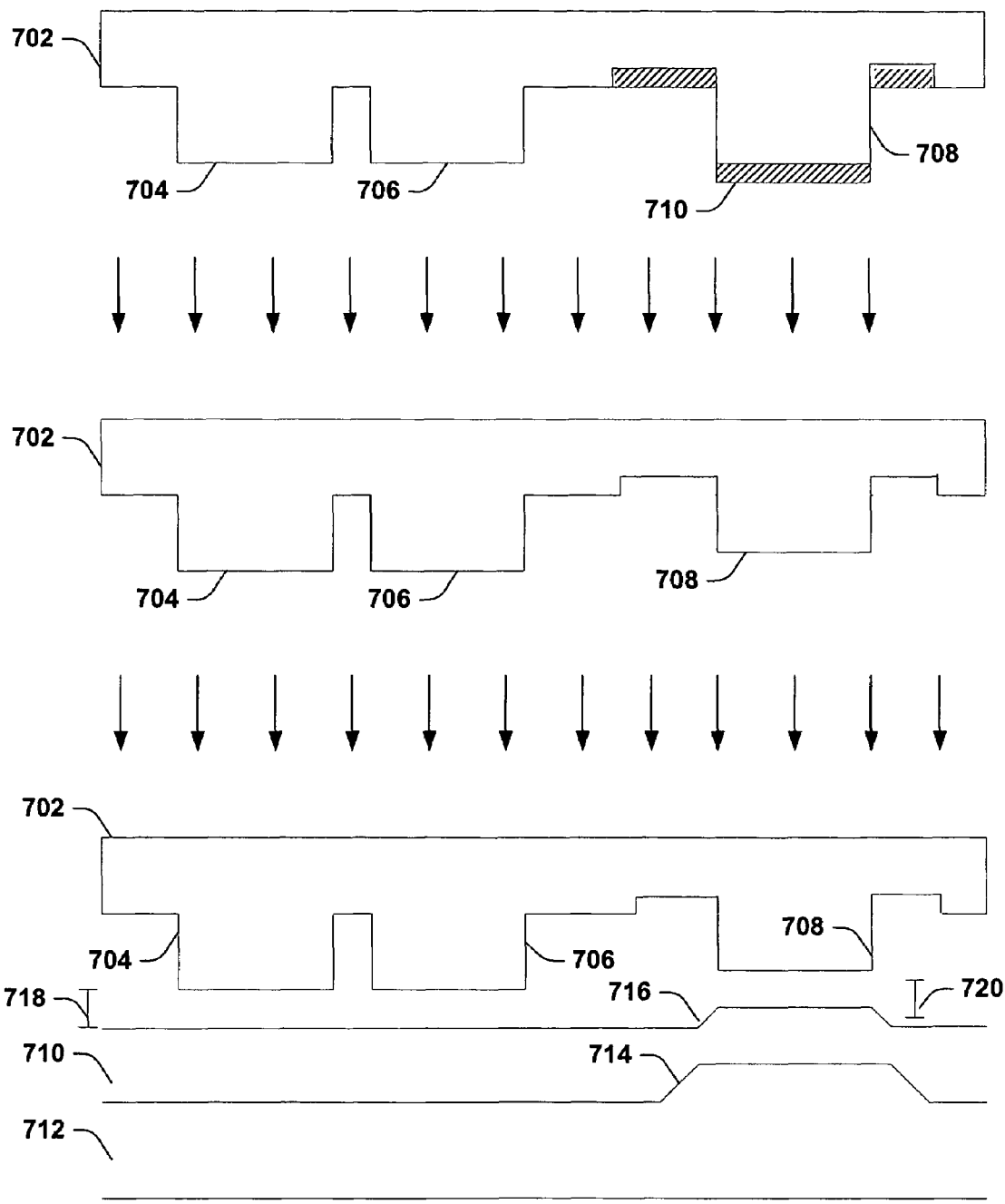
FIG. 7 illustrates a cross-sectional view of an imprint mask in accordance with an aspect of the present invention.

Now turning to FIG. 7, a cross-sectional view 700 of a post fabrication imprint mask 702 having features 704, 706, and 708 is illustrated. Based at least upon the monitored topography, a variation can be detected in which the imprint mask 702 must be compensated by reducing the imprint mask feature 708 by compensating distance 710. In order to compensate for the topography variation, the imprint mask can be etched. A trim etch process (e.g., wet or dry) can be employed on the imprint mask 702, illustrated by a first set of inverted arrows. The trim etch process can remove the portions necessary in order to achieve the correct compensation by means of decreasing the imprint mask feature(s) height. For example, the compensation required can be achieved by etching away the compensating distance 710 on the imprint mask feature 708. It is to be appreciated that the compensating distance 710 can vary from feature to feature. Upon completion of the trim etch process, shown by the first set of arrows, the imprint mask feature 708 has decreased in height allowing for a compensation of the detected topography. In some instances, some surrounding areas of the imprint mask feature 708 in imprint mask 702 are recessed by the extent of removal 710. This causes a step to be formed in the flat areas to the left/right of imprint mask feature 708. This causes the max height of the imprint to be thicker in the transition regions from low/high topography but that does not affect anything since the underlying layer thickness is key.

Although features 704, 706, and 708 of the imprint mask 702 appear as individual features for brevity and simplicity, it is to be understood that features 704, 706, and 708 may (and typically are) each represent the same or different group of features. A group of features may be constituted by a group of features to form a plurality of trenches and/or vias in the substrate layer 712. Features 704, 706, and 708 typically each represent groups of features because it is often impractical to compensate for each individual feature—however it is relatively easy to compensate for local groups of features, since topography is caused by circuit density variations such as memory blocks, random logic, driver blocks etc. Hence, the topography mitigation maintains the photoresist thickness and underlying thickness substantially constant in the (local topography) regions of interest, whereas the transition regions are not critical.

Still referring to FIG. 7, the trim etch process (e.g., wet or dry) provides the compensation of the imprint mask 702 by decreasing the imprint mask feature height. After the completion of the etch process, the imprint mask 702 can be utilized in the lithography process, as shown by the second set of arrows. A variation 714 can exist in the substrate layer 712, which ultimately can be reflected in the transfer layer 710 as shown by 716. However, the variation 714 can be compensated for by employing a modification to the imprint mask 702 in which the imprint mask feature height is adjusted based upon the variation 714 height. In other words, when a variation 714 is detected, the distance from imprint mask features 704, 706, and 708 to the transfer layer 710 can be equivalent or within a declared tolerance by reducing the feature height. A distance 718 between the transfer layer 710 and the imprint mask features 704, 706 is equivalent or within a tolerance level to a distance 720 between the transfer layer 710 and the imprint mask feature 708. The distance 720 is proportional to the amount of variation 714 and amount reflected in the transfer layer 710 as shown by 716. The reduction of the imprint mask feature height allows for the distance between the imprint mask features and the transfer layer to be within a declared tolerance.

Turning now to FIGS. 8-10, in accordance with one or more aspects of the present invention, a mask 802 (or one or more die located thereon) situated on a stage 804 can be logically partitioned into grid blocks to facilitate concurrent measurements of critical dimensions and overlay as the mask matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the mask 802. The mask 802 can be divided into a grid pattern as shown in FIG. 8. Each grid block (XY) of the grid pattern corresponds to a particular portion of the mask 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess mask-to-mask and lot-to-lot variations. For example, a portion P (not shown) of a first mask (not shown) can be compared to the corresponding portion P (not shown) of a second mask. Thus, deviations between masks and lots can be determined in order to calculate adjustments to the fabrication components that are necessary to accommodate for the mask-to-mask and/or lot-to-lot variations.

In FIG. 9, one or more respective portions of the mask 802 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the mask 802 and or one or more die located thereon can be mapped into any suitable number and/or arrangement of grid blocks to effectuate desired monitoring and control.

FIG. 10 is a representative table of concurrently measured critical dimensions and overlay taken at various portions of the mask 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the mask 802 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire mask. It is to be appreciated that fabrication process parameters can be adapted so as to maintain, increase, decrease and/or qualitatively change the fabrication of the respective portions of the mask 802 as desired. For example, when the fabrication process has reached a pre-determined threshold level (e.g., X % of grid blocks have acceptable CDs and no overlay error exists), a fabrication step can be terminated.

Figure 11:
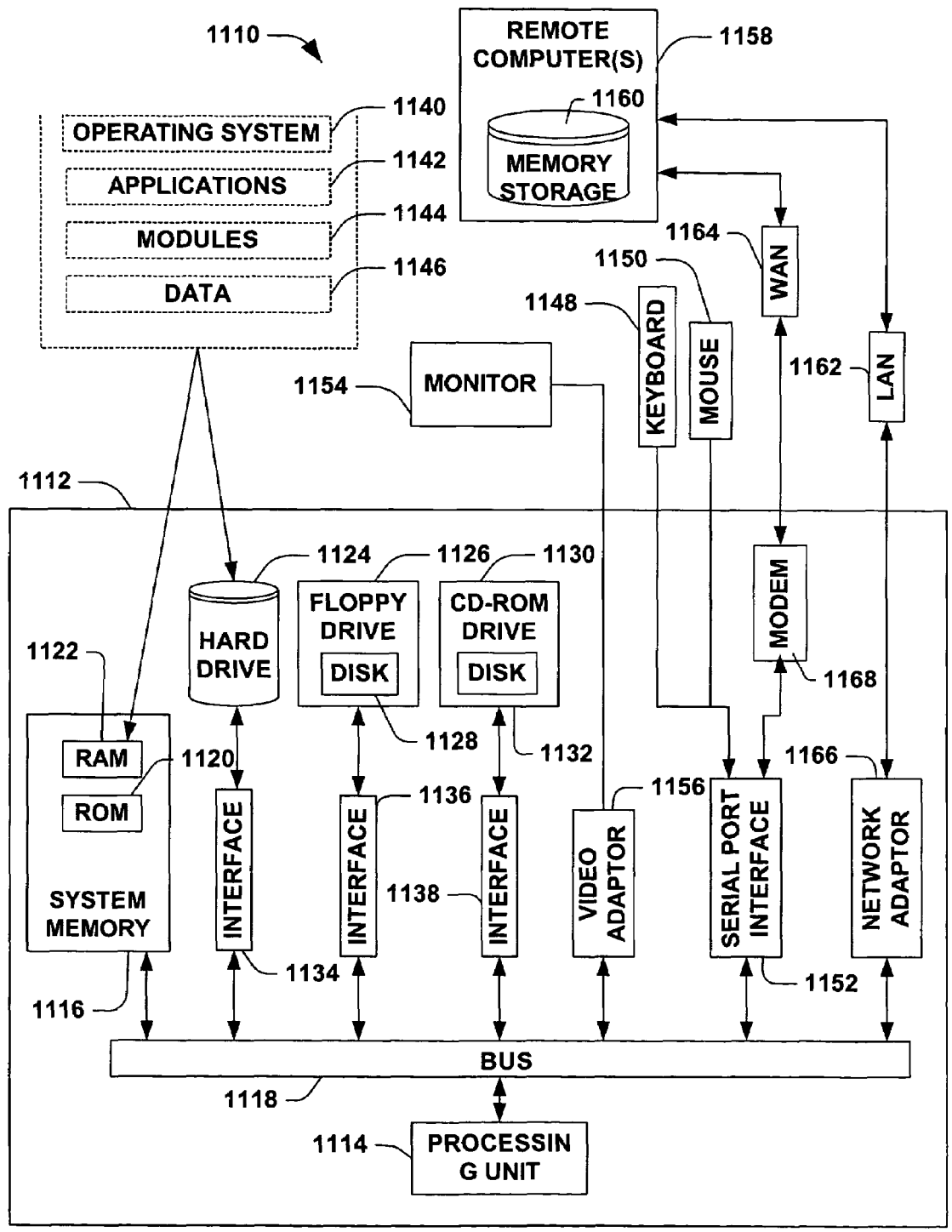
FIGS. 11 and 12 are illustrations of exemplary computing systems and/or environments in connection with facilitating employment of the subject invention.
Figure 12:
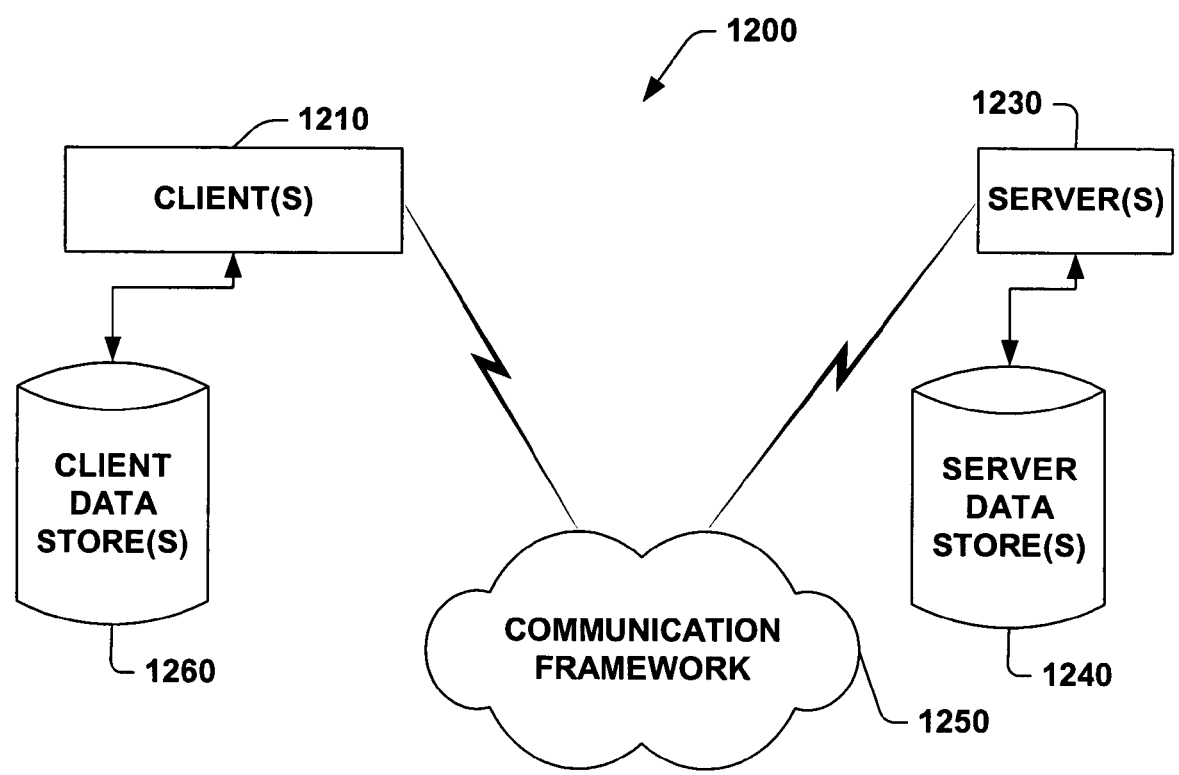

In order to provide a context for the various aspects of the invention, FIGS. 11 and 12 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 11, an exemplary environment 1110 for implementing various aspects of the invention includes a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus utilizing any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1116 includes volatile memory 1120 and nonvolatile memory 1122. The basic input/output system (BIOS), comprising the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable ROM (EEPROM), or flash memory. Volatile memory 1120 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1112 also includes removable/non-removable, volatile/non-volatile computer storage media. FIG. 11 illustrates, for example a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used such as interface 1126.

It is to be appreciated that FIG. 11 describes software that acts as an intermediary between users and the basic computer resources described in suitable operating environment 1110. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the present invention can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment utilizing logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses communication networks such as local-area networks (LAN) and wide-area networks (WAN). LAN technologies include Fiber Distributed Data Interface (FDDI), Copper Distributed Data Interface (CDDI), Ethernet/IEEE 1102.3, Token Ring/IEEE 1102.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

FIG. 12 is a schematic block diagram of a sample-computing environment 1200 with which the present invention can interact. The system 1200 includes one or more client(s) 1210. The client(s) 1210 can be hardware and/or software (e.g., threads, processes, computing devices). The system 1200 also includes one or more server(s) 1230. The server(s) 1230 can also be hardware and/or software (e.g., threads, processes, computing devices). The servers 1230 can house threads to perform transformations by employing the present invention, for example. One possible communication between a client 1210 and a server 1230 can be in the form of a data packet adapted to be transmitted between two or more computer processes. The system 1200 includes a communication framework 1250 that can be employed to facilitate communications between the client(s) 1210 and the server(s) 1230. The client(s) 1210 are operably connected to one or more client data store(s) 1260 that can be employed to store information local to the client(s) 1210. Similarly, the server(s) 1230 are operably connected to one or more server data store(s) 1240 that can be employed to store information local to the servers 1230.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A system for enhancing imprint lithography, comprising:
   a monitor component which detects long range topography variations on a substrate to undergo imprint lithography;
   a control component for modifying feature parameters of features on an imprint mask based at least upon the long range topography variations.

2. The system of claim 1, the monitor component is a scatterometry system.

3. The system of claim 1, the control component utilizes a dry etch process or a wet etch process.

4. The system of claim 3, the artificial intelligence component comprises at least one of a support vector machine, a neural network, an expert system, a Bayesian belief network, fuzzy logic, and a data fusion engine.

5. The system of claim 1, the control component comprises an artificial intelligence component that makes inferences regarding whether to modify the feature parameter.

6. The system of claim 1, the control component etches the feature if the long range topography variation is within a declared tolerance.

7. The system of claim 1, the imprint mask comprises quartz.

8. The system of claim 1, further comprising at least one sensor that gathers data associated with at least one parameter of the feature parameters of the imprint mask or of the long range topography variations.

9. A method for enhancing a feature on an imprint mask used in imprint lithography, comprising:
monitoring a topography of a substrate to be subjected to imprint lithography;
detecting a topography variation in the topography of the substrate; and
compensating for the topography variation by modifying the feature on the imprint mask.

10. The method of claim 9, wherein modifying the feature on the imprint mask comprises etching the feature on the imprint mask if a topography variation is detected.

11. The method of claim 9, wherein modifying the feature on the imprint mask comprises selectively etching the feature on the imprint mask to decrease feature height.

12. The method of claim 9, the monitoring employs a scatterometry system to detect topography variation, and further comprises detecting imprint mask dimensions.

13. The method of claim 12, further comprising employing inferences regarding topography variations to determine whether to initiate compensatory measures for detected topography variations.

14. The method of claim 9, further comprising making inferences regarding topography variations and storing the inferences in a computer readable memory.

15. The method of claim 9, further comprising generating feedback for controlling at least one parameter associated with at least one of monitoring the topography variations and compensating for the topography variations.

16. The method of claim 9, further comprising grid-mapping the imprint mask to a plurality of sections.

17. The method of claim 16, further comprising creating a library of grid-map sections that are non-critical to facilitate a decision regarding initiating compensatory action to mitigate detected topography variations.

18. The method of claim 17, further comprising means for determining whether a detected topography variation is sufficiently mitigated.

19. The method of claim 17, the means for monitoring further comprising means for sensing data associated with at least one physical parameter of the imprint mask.

20. The method of claim 17, the means for selectively compensating for the topography variation comprising means for providing a trim etch.

21. The method of claim 17, further comprising means for generating feedback data for controlling at least one parameter associated the means for monitoring the imprint mask and the means for selectively compensating for the topography variation.

22. A method for enhancing a feature on an imprint mask in imprint lithography, comprising:
means for monitoring topography of a substrate to be processed in imprint lithography; and
means for selectively compensating the feature on the imprint mask for a topography variation.

* * * * *